(12) United States Patent
Suscavage et al.

(10) Patent No.: US 6,676,752 B1
(45) Date of Patent: Jan. 13, 2004

(54) FORMING METAL NITRIDES

(75) Inventors: Michael J. Suscavage, Shirley, MA (US); David F. Bliss, Arlington, MA (US); Michael J. Callahan, Bedford, MA (US); Gerald W. Iseler, Chelmsford, MA (US); John S. Bailey, Temple, NH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 10/083,614

(22) Filed: Feb. 26, 2002

(51) Int. Cl.[7] ................................................. C30B 23/06
(52) U.S. Cl. .................. 117/104; 117/952; 204/298.12; 204/298.14; 427/255.36; 427/255.394
(58) Field of Search ........................ 117/84, 104, 952; 204/298.12, 298.13; 427/255.39, 255.394

(56) References Cited

U.S. PATENT DOCUMENTS

| | | | | |
|---|---|---|---|---|
| 3,959,446 A | * | 5/1976 | Mazdiyasni et al. | 423/344 |
| 4,144,116 A | * | 3/1979 | Jacob et al. | 333/150 |
| 6,113,985 A | * | 9/2000 | Suscavage et al. | 427/255.39 |

* cited by examiner

*Primary Examiner*—Felisa Hiteshew
(74) *Attorney, Agent, or Firm*—Thomas C. Stover

(57) ABSTRACT

Method and apparatus are provided for forming metal nitrides (MN) wherein M is contacted with iodine vapor or hydrogen iodide (HI) vapor to form metal iodide (MI) and contacting MI with ammonia to form the MN in a process of reduced or no toxicity. MN is then deposited on a substrate, on one or more seeds or it can self nucleate on the walls of a growth chamber, to form high purity metal nitride material. The inventive MN material finds use in semiconductor materials and in making nitride electronic devices as well as other uses.

18 Claims, 3 Drawing Sheets

FORMING METAL NITRIDES

RELATED APPLICATIONS

The application relates to U.S. Pat. No. 6,113,985 by Suscavage et al (2000) and U.S. patent application Ser. No. 09/299,928 now U.S. Pat. No. 6,406,540 by Meckie Harris et al, still pending as, well as AFB00614, filed herewith, all of which relate to the formation of metal nitrides.

STATEMENT OF GOVERNMENT INTEREST

The invention described herein may be manufactured and used by or for the Government for governmental purposes without the payment of any royalty thereon.

FIELD OF THE INVENTION

This invention relates to preparation of metal nitrides, particularly preparation thereof by methods of reduced toxicity.

BACKGROUND OF THE INVENTION

The present invention relates to semiconductor materials, and, in particular, relates to nitride materials including GaN.

Gallium nitride was first grown by H. P. Maruska and J. J. Tietjen (Applied Physics Letters, 15 (1969) 32) using hydride vapor phase epitaxy (HVPE). It involves the use of gaseous hydrogen chloride to flow over and pick up the metal and produce the metal chloride. The metal chloride is then reacted with ammonia to form the metal nitride. Substrates of choice for the growth of the metal nitride are sapphire ($Al_2O_3$) or silicon carbide (SiC). This process is isolated from the atmosphere by a fused quartz reactor tube and is typically carried out at a temperature of 1050° C. Today, this is still one of the methods of choice for growing nitrides.

One drawback to the use of hydrogen chloride is the toxic and corrosive nature of the gas. All components used in the system must be very dry or the parts (i.e. stainless steel valves, mass flow controllers, tubing, fittings, and connections) will oxidize, rendering the system useless. Hydrogen chloride is toxic in that it will form hydrochloric acid upon contact with water in the eyes or lungs or elsewhere.

In other prior art there is U.S. Pat. No. 6,113,985 (2000), which relates to the preparation of metal nitrides but in needles rather then in crystals or film form.

Accordingly there is need and market for a process for producing metal nitrides such as GaN, AlN, InN or ternary or quaternary combinations thereof in a manner that overcomes the above prior art shortcomings.

There has now been discovered a method for producing the above and other metal nitrides in a reduced toxic or nontoxic manner.

SUMMARY OF THE INVENTION

Broadly, the present invention provides a method for forming metal nitrides (MN) which includes contacting metal (M) with hydrogen iodide (HI) or iodine ($I_2$) vapor to form the metal iodide (MI) and then contacting the MI with ammonia to form the MN.

Such MN is preferably in the form of gallium nitride (GaN), aluminum nitride (AlN), indium nitride (InN) or quaternary or ternary combinations thereof.

The invention also provides a reactor for forming a metal nitride (MN) comprising, a) a first container,
b) the container having an upstream inlet, followed by an upstream boat for iodine ($I_2$), a second boat for M spaced downstream from the upstream boat and an outlet located downstream from the second boat,
c) means for heating the two boats,
d) means for flowing iodine from the first boat or for flowing hydrogen iodide (HI) from the inlet), downstream to the second boat, to contact the M to form MI vapor and flowing the MI vapor out the outlet and
e) means to contact the outlet MI vapor with ammonia to form the MN.

Definitions:

By "ammonia" as used herein, is meant ammonia gas.

By "MN", as used herein, is meant metal nitride or metal nitrides.

By "heated metal", as used herein, is meant metal heated from 500 to 1000° C., including molten metal.

As will be seen herein, the invention provides a two-step process in which the metal iodide (MI) is formed in the first step, which MI is subsequently converted to MN in the second step, all at ambient pressure, which deposits in the forms noted herein. Such process is known as Iodine Vapor Phase Growth (IVPG).

BRIEF DESCRIPTION OF THE DRAWINGS

The invention will become more apparent from the following detailed specification and drawings in which;

FIG. 1 is an elevation schematic view of an apparatus embodying the invention employed in metal halide and nitride formation while;

DESCRIPTION OF PREFERRED EMBODIMENTS OF THE INVENTION

The invention provides a process and apparatus for producing M-nitride materials wherein M=gallium (GaN), aluminum (AlN), indium (InN), and ternary nitrides such as gallium aluminum nitride (GaAlN) and gallium arsenic nitride (GaAsN), as well as quaternary nitrides such as gallium aluminum indium nitride (GaAlInN) and gallium arsenic indium nitride (GaAsInN). The process provides for depositing layers on a substrate by epitaxial growth, seeded growth on small single crystals, or self-nucleated freestanding single crystals. High purity polycrystalline material can also be formed for use in other processes.

The process can use a solid iodine source or gaseous hydrogen iodide. Typically, the mildly heated iodine source is moved as a vapor by a carrier gas to react with the M-metal forming M-metal iodide such as gallium iodide. The carrier gas can be hydrogen or inert or combination thereof. Once the M-metal iodide is formed, the carrier gas moves the M-metal iodide out of the isolated reaction area to a section of the reaction chamber where the M-metal iodide can intermingle and react with ammonia gas. In this system, the iodine and M-metal are isolated from the ammonia until the M-metal iodide is formed.

The deposition process and quality of the deposited metal nitride are adjusted and controlled by varying the temperature of the iodine source, the M-metal-iodine reaction, and the M-metal iodide-ammonia reaction. Varying the temperature of the iodine source controls the amount of iodine available to react with M-metal. The temperature of the M-metal source controls the amount of M-metal iodide entrained in the gas stream. The temperature where the M-metal iodide intermingles with the ammonia, as well as the flow rates thereof, control the kinetics of forming the metal nitride, which in-turn, controls the quality of the deposited metal nitride be it in bulk or film form.

Figure 1:
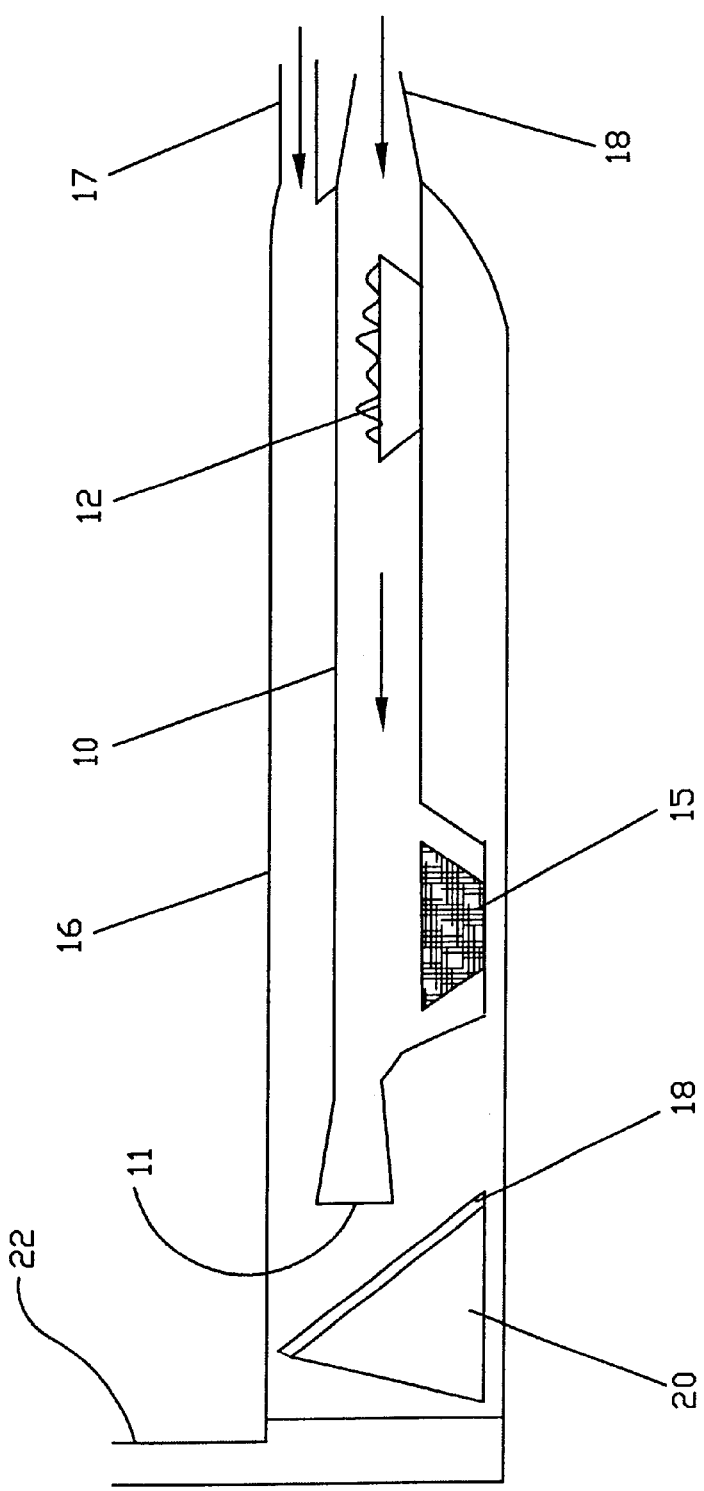
Figure 2:
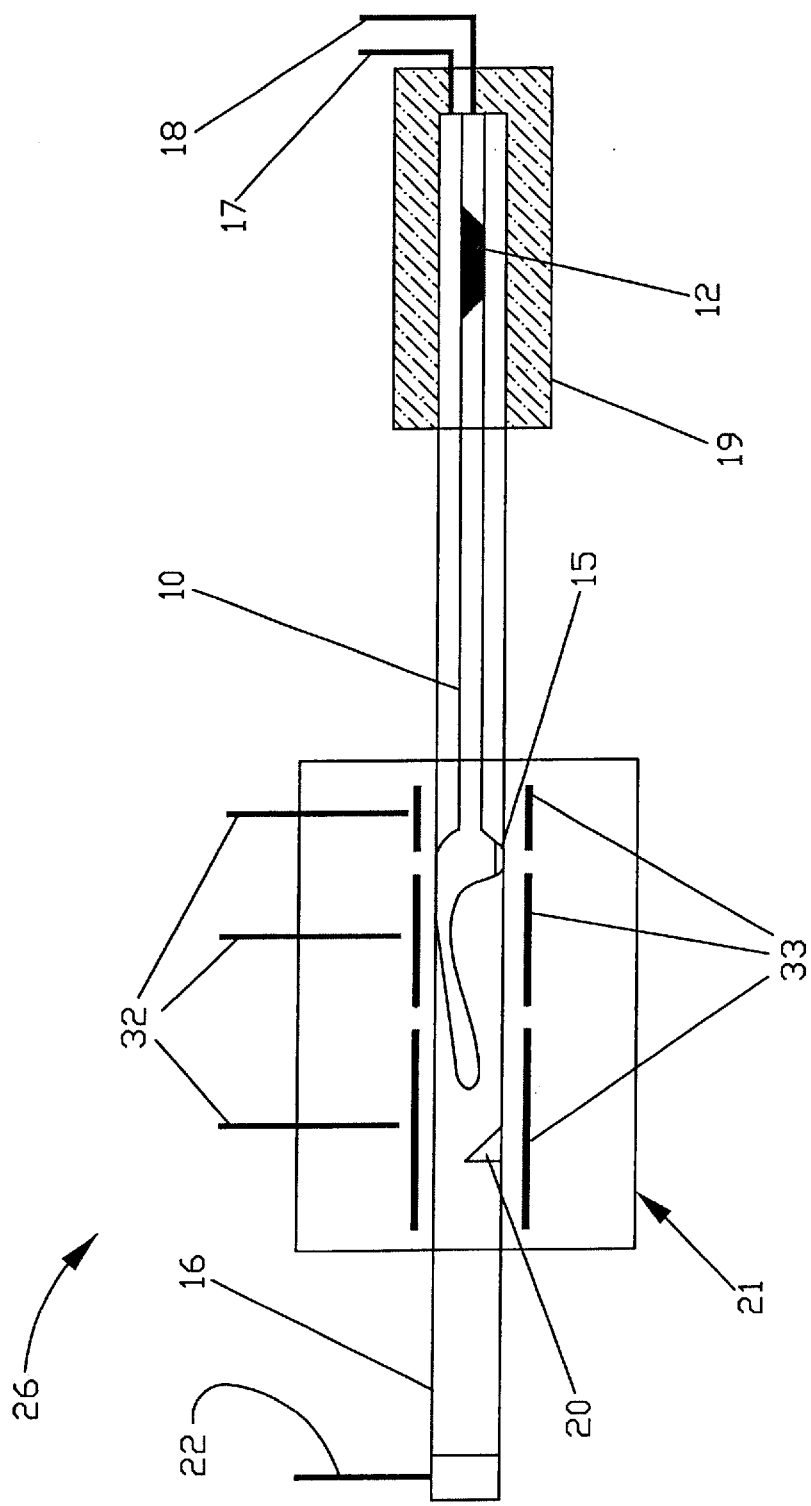
FIG. 2 is an elevation schematic view of an apparatus, embodying the invention, for formation of metal halide and conversion to metal nitride, while incorporating an apparatus similar to that shown in schematic in FIG. 1 and, FIG. 3 is a fragmentary elevation schematic view of an exhaust component which can be attached to either embodiment shown in FIGS. 1 and 2.

FIGS. 1 and 2 are illustrations of a preferred embodiment for forming the M-metal nitride material. FIG. 1 shows detail of the iodine and M-metal system for forming the M-metal iodide and substrate holder. FIG. 2 shows the complete system with placement of the furnace for heating the M-metal and substrate and placement of the heating jacket for warming the iodine. This system is currently operated in a horizontal configuration but with some modification, any chemical vapor deposition system (CVD) is equally acceptable.

In this process, iodine is made to react with the metal of choice under conditions that are favorable to produce the metal iodide. The metal iodide is then carried to another chamber where it is made to react with ammonia under favorable conditions to produce the metal nitride.

Referring to FIG. 1, fused quartz tube 10 is loaded with iodine in boat 12. The metal of choice is loaded in boat 15 and is also placed in fused quartz tube 10. The loaded fused quartz tube 10 is loaded into fused quartz tube 16. A substrate is placed on the substrate holder 20 and also loaded into fused quartz tube 16. End cap 22 is connected to the fused quartz tube 16 and the assembly is placed in furnace 21 having heater plates 33 & thermocouples or temperature controls 32, as shown in FIG. 2.

Referring to FIG. 2, an ammonia gas line is connected to inlet 17 and a gas line with hydrogen, inert, or a combination of these gases is connected to inlet 18. An exhaust gas line that scrubs the ammonia is connected to end cap 22, as discussed below per FIG. 3. The sealed system is now purged using gas inlet lines 17 and 18 to remove residual atmospheric gases such as oxygen and water vapor or can be evacuated and then purged as above. The boat 12, with the iodine, is kept cool to limit the vaporization of the iodine during the purge cycle and furnace heating. Once the fused quartz tube 16 is purged, furnace 21 is heated to the appropriate temperature to remove oxides and other contaminates from the metal of choice in boat 15. With the gases continuing to flow into inlets 17 and 18, a heating jacket 19 is placed around the fused quartz tube 16 with the iodine boat 12 contained therein. Power is applied to heating jacket 19 to cause the iodine in boat 12 to vaporize and become entrained in the gas stream entering gas inlet 18. The iodine travels down the inside of fused quartz tube 10 to react with the metal in boat 15. After reaction, the metal iodide travels out the open end 11 of fused quartz tube 10 towards the substrate holder 20. Once the metal iodide flows out of fused quartz tube 10, it reacts with the ammonia that has entered inlet 17 and traveled to the vicinity of the substrate holder. A reaction can now proceed where the metal iodide and ammonia react to form the metal nitride. The reaction temperature to produce the metal iodide is not necessarily the same as for the reaction to produce the metal nitride, but it can be.

Figure 3:
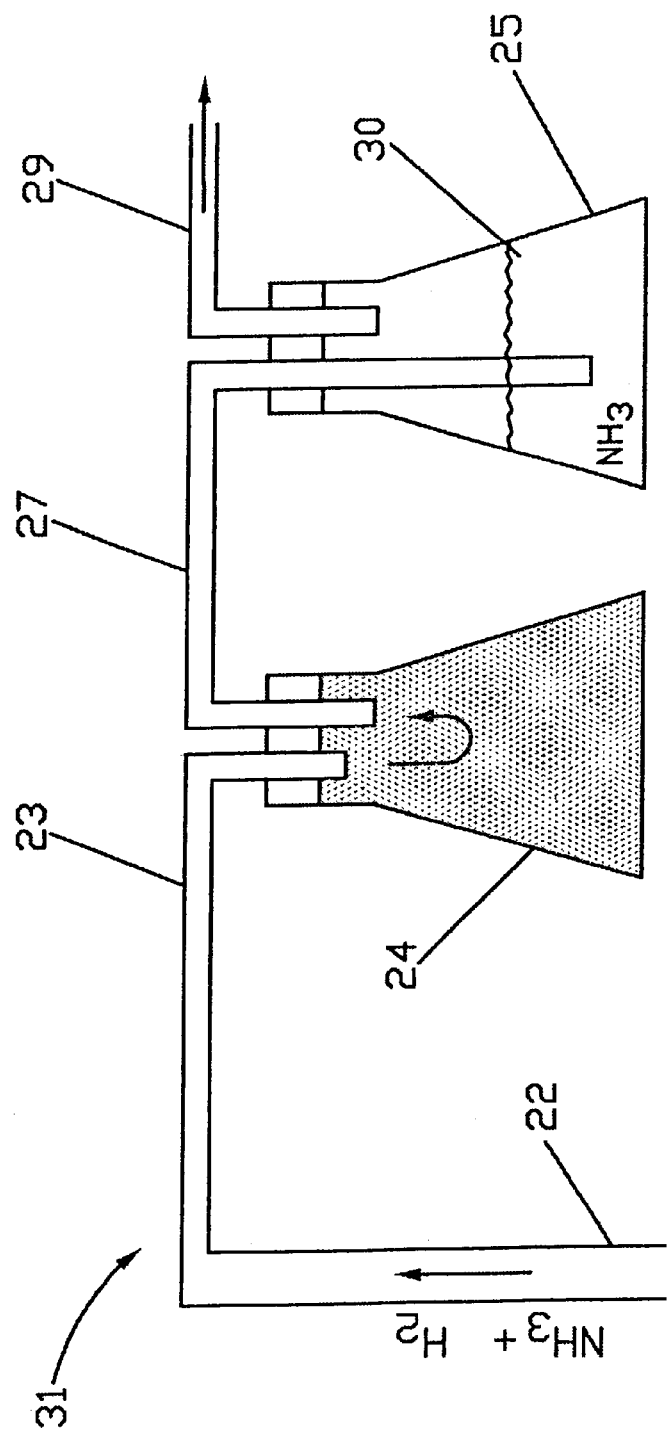

Optionally, outlet 22, at the exit end of the container 16, of the inventive reactor 26, can lead to an ammonia trap 31 per FIG. 3. That is, outlet 22 connects by pipe 23 to flask 24, which connects in turn by pipe 27 to flask 25, below the level of water 30, to absorb ammonia gas therein while pipe 29 connects flask 25 and the system to the atmosphere. In operation, exhaust gases, such as ammonia and hydrogen, flow from outlet 22 to flask 24 and then into flask 25, where, e.g., ammonia is captured by the water 30 therein.

In case the pressure drops within the container 16, below atmospheric pressure, e.g., due to a shut off of heaters 33 and/or 19, shown in FIG. 2, the ammonia water 30 can flow from flask 25 through pipe 27 into flask 24 under atmospheric air which enters flask 25 though pipe 29.

Thus the flask 25 is a trap for exhaust gases such as ammonia and hydrogen when the container 16 has a positive pressure and the flask 24 is a trap for the back flow of ammonia water from flask 25, when the container 16 has a pressure below one atmosphere or 760 Torr, so that the ammonia water is trapped in flask 24 and not sucked through pipe 23 back into the system housing container 16 to the detriment of MN crystals grown therein.

Accordingly, the method of the invention is considered as being run at about 1 atm. pressure at the exit end of the above reactors 10 & 16.

Heat is applied to the respective heating zones of FIGS. 1 and 2 preferably as follows. In heating zone 19 the iodine boat 12 is heated to a range of 80–110° C. and preferably to about 100° C. Then the metal boat 15 is heated in a range of 800–1000° C. and preferably to about 900° C. The reaction zone containing the substrate holder 20 is heated between 1000–1100° C. and preferably to 1050° C.

Accordiingly, the iodine boat 12 contains solid iodine, which when heated, as noted above, vaporizes out of the boat for flow downstream in the tube 10 toward the metal boat 15, depleting the solid iodine in the boat, which iodine is replenished from time to time.

Also the metal in the metal boat 15, whether of gallium, aluminum or indium will be molten and on contact, will react with the flowing $I_2$ or HI, to form the respective MI, which has a high vapor pressure compared with the respective molten metals and such MI will vaporize and flow out of the boat, downstream toward outlet 11 of the container 10, exposing the underlying liquid metal in the boat to further MI formation and flow-off.

As noted above, the iodine in the boat is heated and emits $I_2$ vapors which are contacted and transported by incoming hydrogen. Then the iodine vapors contact and react with molten gallium, to produce GaI, preferably in a molar ratio of Ga/I close to unity, which is known to be the stable form of gallium iodide at elevated temperatures.

If HI is fed to the reactor 10, it is fed via inlet port 18, per FIG. 1 and the $I_2$ boat 12 can be omitted.

The flow rates of $I_2$ or HI can range from 4–16 sccm, the ammonia flow rate between 125 and 400 sccm so as to obtain a growth rate of GaN crystals of 5–40 μm/hr, all at a pressure of about 1 atmosphere at the exhaust end of the system, as noted above.

An example of the reaction between the iodine and gallium occurs in the following manner:

$$I_2 + 2Ga \rightarrow 2GaI \tag{1}$$

And for reaction with ammonia,

$$GaI + 4NH_3 \rightarrow GaN + 4H_2 + N_2 + NH_4I \tag{2}$$

Also an iodide can be employed in place of iodine. For example, when hydrogen iodide is used instead of iodine, the initial reaction occurs as:

$$2HI + 2Ga \rightarrow 2GaI + H_2 \quad (3)$$

The reaction between the gallium iodide and ammonia would be the same as reaction (2).

The following example is intended to illustrate the present invention and should not be construed in limitation thereof.

EXAMPLE 1

As noted above, FIGS. 1 and 2 illustrate a fused quartz reaction tube and a 3-zone furnace. Iodine was contained in a fused quartz boat 12, gallium was contained downstream in a fused quartz boat 15, while a substrate 18 was mounted on a holder 20 in tube 16, as shown or indicated in FIGS. 1 and 2.

The gallium boat was held at 900° C. for all growth runs. Purified hydrogen between 100 and 400 sccm flowed over heated (95° C.) iodine to produce an $I_2$ flow equivalent to 4–16 sccm. The ammonia flow rate was between 125 and 400 sccm.

The reaction zone containing the substrate was held between 1000° C. and 1110° C. A white deposit on the exhaust side of the reactor was confirmed as $NH_4I$ by powder x-ray diffraction. Growth rates of GaN at 5 to 40 μm/hr on the substrate 18, were achieved, depending on gas flow rates, substrate and/or iodine temperature, and sample orientation.

Per the invention, the temperature of the iodine boat in the reactor can range from 80–100° C. The temperature of the metal boat can range from 500–1000° C. and preferably from 900–975° C. and the temperature in the substrate zone can range from 500–1300° C. and preferably from 1000–1125° C. The flow rates of $I_2$ or HI can range, in the small tube or container, from 4–20 sccm and in the large external tube or container, from 100–400 sccm for the ammonia flow rate, at ambient pressure, so as to obtain a growth rate of MN of 5–40 m/hr. and a resulting film thickness of 5–500 μm.

For a further discussion on the above method and the resulting GaN films grown, see a Paper entitled "New Iodide Method for Growth of GaN" by Michael Suscavage et al, published on Nov. 22, 2001 in Physica Status Solidi, Vol. 188, p 477, which Paper is incorporated herein by reference.

As indicated in FIG. 1, the above example was carried out at atmospheric pressure, with an ammonia water trap, per FIG. 3, mounted at the downstream end of the reactor tube 16.

Thus the present invention relates to a method for the production of M-nitride materials, where M is gallium (GaN), Aluminum (AlN), indium (InN), and ternary and quaternary combinations of the above such as GaAlN.

Accordingly the invention provides a new process in which elemental iodine or an iodide, in vapor form, is caused to flow over a desired molten metal such as gallium. The iodine or hydrogen iodide reacts with the metal to form the metal iodide. The metal iodide is volatile at elevated temperatures and flows downstream to react with ammonia to form the metal nitride. The metal nitride can deposit on a substrate to form a nitride film, either thin or thick, it can deposit on a nitride seed single crystal to grow larger single crystals, or it can self nucleate on the walls of the growth chamber to form high purity metal nitride material. Large single crystals grown by this method can be used as substrates for making nitride electronic devices.

Thus it is believed that the apparatus and method or process of the invention have several advantages over the currently used hydrogen chloride based process. The inventive process can operate at lower temperatures than the hydrogen chloride process and obtain the same quality nitride material as measured by x-ray and photoluminescence. Iodine is a solid source contained within the system whereas hydrogen chloride is a corrosive, toxic gas that must be piped into the system from an external tank. With the iodine source, none of the valves or expensive mass flow controllers is subjected to the deteriorating effects of hydrogen chloride.

As noted above the two-step method of the invention for making metal nitrides can operate at lower temperatures than prior art methods, which can result in lower power consumption, lower defect densities, lower dissociation of Group III-Ns during growth and lower thermal stress in the metal nitride product.

Nitride materials can enable electronic devices to operate in environments where higher temperatures are encountered without being actively cooled by a heavy, power hungry, space intensive external cooling system. The shorter operating wavelength of solid state lasers made from nitride alloys, allows the beam to be focused to a smaller spot size which enables higher storage densities on CD disks. By combining red, green, and blue light from light emitting diodes (LEDs), one can envision a solid state white light source that would be very efficient. Metal nitrides of the invention can also be used in UV detectors as well as in high temperature electronics, as indicated above.

What is claimed is:

1. A method for forming metal nitrides (MN) comprising, contacting a heated metal with iodine vapor ($I_2$) or hydrogen iodide (HI) vapor to form metal iodide (MI) and contacting said MI with ammonia gas to form said MN.

2. The method of claim 1 wherein said M is gallium, aluminum, indium or alloys thereof.

3. The method of claim 1 wherein said MN is gallium nitride (GaN), aluminum nitride (AlN), indium nitride (InN) and ternary and quaternary nitrides of gallium aluminum nitride (GaAlN), gallium arsenic nitride (GaAsN), gallium aluminum indium nitride (GaAlInN) or gallium arsenic indium nitride (GaAsInN).

4. The method of claim 1 wherein said MI is formed in one locale and then flows to another locale to react with ammonia to form said MN.

5. The method of claim 1 wherein said MN is formed as a vapor and deposited on a substrate or a seed or self nucleates on a nearby surface.

6. The method of claim 1 wherein
  a) iodine is placed in a first boat upstream in an elongated first container below an inlet for $H_2$ or HI,
  b) metal is placed in a second boat spaced downstream of said first boat in said first container, with an outlet thereof being positioned downstream of said second boat,
  c) heating said second boat to heat the metal therein,
  d) heating said first boat to cause iodine vapor therefrom to flow downstream to contact said metal to form MI vapor or flowing said HI from said inlet downstream to contact said metal to form MI vapor,
  e) flowing said MI vapor out said outlet and
  f) contacting said MI vapor with said ammonia to form said MN.

7. The method of claim 6 wherein a substrate is positioned proximate and downstream of said outlet and said MN vapor is deposited on said substrate.

8. The method of claim 7 wherein the outlet of said first container projects into or near a second container having ammonia vapor therein and flowing said MI into said second container to contact said ammonia vapor and form an MN vapor for deposit on a substrate, on one or more seeds or to self nucleate on the interior surfaces of said second container.

9. The method of claim 1 operated at about 1 atmosphere pressure.

10. The method of claim 1 wherein said MI is formed by the reaction;

$$I_2 + 2M \rightarrow 2MI$$

or by $2HI + 2M \rightarrow 2MI + H_2$.

11. The method of claim 1 wherein said MN is formed by the reaction:

$$MI + 4NH_3 \rightarrow MN + 4H_2 + N_2 + NH_4I.$$

12. A reactor for forming a metal nitride (MN) comprising,
   a) a first container,
   b) said container having an upstream inlet, followed by a first boat for iodine ($I_2$), a second boat for M spaced downstream from said first boat and an outlet located downstream from said second boat,
   c) means to maintain the pressure in said container to about 760 Torr,
   d) means for heating the two boats,
   e) means for flowing iodine vapor from said first boat or for flowing hydrogen iodide (HI) from said inlet downstream to said second boat to contact said M to form metal iodide (MI) vapor and for flowing said MI vapor out said outlet and
   f) means to contact the outlet MI vapor with ammonia to form said MN.

13. The reactor of claim 12 having a substrate positioned proximate to and downstream of said outlet and means to deposit said MN vapor on said substrate as a layer.

14. The reactor of claim 12 wherein the outlet of said first container extends into or proximate a second container which holds ammonium vapor and means for flowing said MI vapor through said outlet and into said second container to form MN vapor and to deposit said MN vapor on one or more seeds or to self nucleate on the walls of said second container.

15. The reactor of claim 14 wherein said first and second containers are elongated.

16. The reactor of claim 14 wherein a substrate is mounted in said second container proximate said outlet for deposit of said MN vapor thereon.

17. The reactor of claim 12 having a liquid trap for exhaust gases near the exit end of said reactor.

18. The reactor of claim 17 wherein said trap is open to the atmosphere.

* * * * *